United States Patent [19]

Schneider, Jr.

[11] 4,321,546

[45] Mar. 23, 1982

[54] AEROSOL CAN STATIC ELECTROMETER

[75] Inventor: Clayton J. Schneider, Jr., East Aurora, N.Y.

[73] Assignee: Calspan Corporation, Buffalo, N.Y.

[21] Appl. No.: 140,521

[22] Filed: Apr. 15, 1980

[51] Int. Cl.³ .............................................. G01R 5/28
[52] U.S. Cl. .................................... 324/457; 324/452
[58] Field of Search ................... 324/122, 71 CP, 72, 324/72.5, 464, 452, 457, 458, 459, 158 P

[56] References Cited

U.S. PATENT DOCUMENTS 3,296,491  1/1967  Brown .
3,644,828  2/1972  Gathman .
3,812,419  5/1974  Kaunzinger .
3,821,603  6/1974  De La Cierva .
3,991,311  11/1976  Plumadore .
3,997,839  12/1976  Dreyfus .
4,139,879  2/1979  Laws .

OTHER PUBLICATIONS

J. R. Greaves, "A Grid Collection Method for the Measurement of Electrostatic Charge in Aerosol Systems", *Aerosol Age*, vol. 25, No. 2, Feb. 1980, pp. 18–22, 36, 38, 40, 42.

*Primary Examiner*—Michael J. Tokar
*Attorney, Agent, or Firm*—Biebel, French & Nauman

[57] ABSTRACT

An aerosol can is dispensed through an electrically isolated screen from a fixed distance which induces a charge on the screen from the passing cloud. The charge is conducted by wire into a capacitor where the charge builds up and is measured as a voltage by means of a high impedance voltmeter.

2 Claims, 1 Drawing Figure

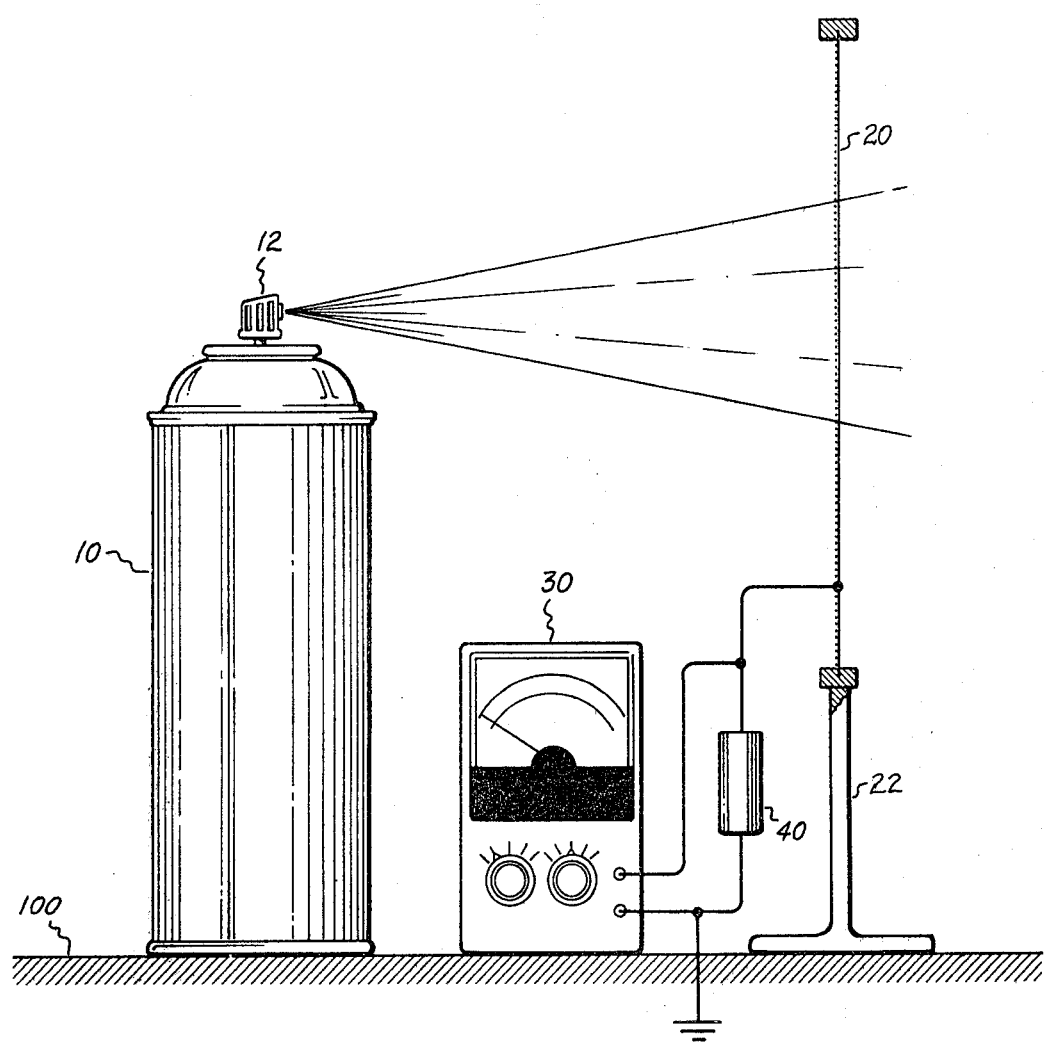

AEROSOL CAN STATIC ELECTROMETER

BACKGROUND OF THE INVENTION

When aerosol cans dispense their contents a static charge can be generated. Because flammable propellants are often used, there may be the potential for igniting the output cloud through a static electric discharge. Because of this buildup of electrostatic charge, it has become necessary to measure the electrostatic charge in aerosol systems, see, for example J. R. Greaves and B. Makin, "A grid collection method for the measurement of electrostatic charge in aerosol systems", *Aerosol Age* February 1980.

SUMMARY OF THE INVENTION

The present invention is directed to a device for assessing static charge generation by aerosol cans during spraying. Basically, an aerosol is sprayed through a screen and a reproducable and proportional part of the resultant charge is induced upon the screen through which the aerosol is sprayed. The screen is electrically isolated and the charge induced upon the screen is conducted by wire into a low loss capacitor where the charge builds up. A high impedance voltmeter measures the charge on the capacitor to give a direct quantitative measure of the static charge induced on the screen.

It is an object of this invention to provide a method and apparatus for assessing the potential hazards due to electrostatic charging of an aerosol container during discharge of its contents.

It is a further object of this invention to provide a method and apparatus for quickly and accurately determining the static charge produced by aerosol spraying. These objects, and others as will become apparent hereinafter, are accomplished by the present invention.

BRIEF DESCRIPTION OF THE DRAWING

For a fuller understanding of the present invention reference should now be made to the following detailed description thereof taken in conjunction with the accompanying drawings wherein:

The FIGURE is a pictorial view of the apparatus.

DESCRIPTION OF THE PREFERRED EMBODIMENT

Referring now to the drawing, the numeral 10 designates an aerosol spray can having a spray cap 12. The spray can 10 is located on an electrically insulated base 100 which is made of Lucite in the preferred embodiment. Screen 20, in the preferred embodiment, is made from ¼" expanded mesh steel and is 25 cm square and is located 23 cm from the spray cap 12 and across the path of the discharging contents of aerosol spray can 10. Screen 20 is supported by an electrically insulating support 22 and rests on Lucite base 100. The screen 20 is connected to high impedance (over 100 megohms in the preferred embodiment) voltmeter 30 and to ground through low loss capacitor 40 which is 0.5 μF in the preferred embodiment.

OPERATION

With the apparatus located and connected as described above, the spray cap 12 is pushed down with a Lucite rod (not illustrated). The discharging contents generates an equal and opposite charge on the can 10 and the dispersed contents. Depending upon the porosity of screen 20, a reproducable and proportionate portion of the charge (about 85% in the preferred embodiment) is induced upon the screen 20 during the dispensing process. The charge generated upon screen 20 is stored in low loss 0.5 μF capacitor 40. The voltage across capacitor 40 is measured by meter 30 which is preferably of the digital type. The measured voltage, V, is related to the charge, Q, for a given capacitance, C, by the relation $$Q = CV$$

Since C is known and V is measured Q can then be determined.

Absolute calibration would be achieved by discharging the contents of an aerosol can through a series of screens and determining the charge on each screen in the manner described above. Using this data the absolute charge can be extrapolated.

Although a preferred embodiment of the present invention has been illustrated and described, changes will obviously occur to those skilled in the art. It is therefore intended that the presented invention is to be limited only by the scope of the appended claims.

I claim:

1. A method for assessing static charge generation by an aerosol container during discharge and including the steps of:
   discharging an aerosol container through an electrically isolated screen; and
   measuring the voltage induced upon a capacitor connected to the screen to thereby permit the determination of the static charge generated.

2. Apparatus for assessing the static charge generation by an aerosol container during discharge and including:
   a screen;
   means for supporting and electrically isolating said screen;
   a low loss capacitor connected to said screen; and
   a high impedance voltmeter connected for measuring the voltage produced on said capacitor when an aerosol container has been discharged through said screen to thereby permit the determination of the static charge generated.

* * * * *